US 12,273,085 B2

(12) United States Patent
Cretu (10) Patent No.: US 12,273,085 B2
(45) Date of Patent: Apr. 8, 2025

(54) ATTENUATION CIRCUITRY

(71) Applicant: Socionext Inc., Kanagawa (JP)

(72) Inventor: Vlad Cretu, Maidenhead (GB)

(73) Assignee: SOCIONEXT INC., Kanagawa (JP)

( * ) Notice: Subject to any disclaimer, the term of this patent is extended or adjusted under 35 U.S.C. 154(b) by 258 days.

(21) Appl. No.: 17/837,562

(22) Filed: Jun. 10, 2022

(65) Prior Publication Data

US 2022/0407502 A1    Dec. 22, 2022

(30) Foreign Application Priority Data

Jun. 18, 2021   (EP) ..................... 21180452

(51) Int. Cl.
    *H03H 11/24* (2006.01)
(52) U.S. Cl.
    CPC ................. *H03H 11/245* (2013.01)
(58) Field of Classification Search
    CPC .................................................. H03H 11/245
    See application file for complete search history.

(56) References Cited

U.S. PATENT DOCUMENTS

| 6,229,375 | B1 | 5/2001 | Koen |
| 2007/0249311 | A1 | 10/2007 | Murphy |
| 2015/0011171 | A1 | 1/2015 | Akbari-Dilmaghani |
| 2018/0227658 | A1 | 8/2018 | Kumar et al. |
| 2024/0030898 | A1* | 1/2024 | Francis .......... H03K 19/017509 |

FOREIGN PATENT DOCUMENTS

| CN | 111817689 A | * | 5/2018 | .......... H03H 11/245 |
| CN | 111404511 A | * | 7/2020 | ............. H03H 11/24 |
| CN | 108023572 A | * | 10/2020 | |
| EP | 1 351 400 A2 | | 10/2003 | |
| EP | 1 351 400 A3 | | 3/2004 | |

OTHER PUBLICATIONS

Extended European Search Report dated Dec. 1, 2021 issued in the corresponding European Patent Application No. 21180452.1.

* cited by examiner

*Primary Examiner* — Daniel C Puentes
(74) *Attorney, Agent, or Firm* — Rimon P.C.

(57) ABSTRACT

Differential attenuation circuitry, including: first and second input nodes; first and second output nodes; and an impedance network connected between the first and second input nodes and the first and second output nodes to provide a differential output voltage signal between the first and second output nodes which is attenuated compared to a differential input voltage signal applied between the first and second input nodes, wherein the impedance network includes: a common-mode node; a first impedance network connected between the first input node, the common-mode node and the first output node; and a second impedance network connected between the second input node, the common-mode node and the second output node, and wherein the differential attenuation circuitry further includes: an input-to-input path comprising one or more impedances and one or more switches connected between the first and second input nodes to provide a current path independent of the common-mode node.

13 Claims, 11 Drawing Sheets

ATTENUATION CIRCUITRY

CROSS-REFERENCE OF RELATED APPLICATIONS

This application claims the benefit of European Patent Application No. 21180452.1, filed on Jun. 18, 2021, the entire disclosure of which Application is incorporated by reference herein.

The present invention relates to attenuation circuitry, in particular to differential attenuation circuitry, for example for use in an analogue-to-digital converter (ADC). Such circuitry may be implemented as integrated circuitry, for example on an IC chip.

In such circuitry, a signal may be required to have a particular amplitude/power, and differential attenuation circuitry may therefore be configured to provide an output signal that has a reduced amplitude/power compared to an input signal. With increasing speeds of such circuitry, and corresponding miniaturisation of semiconductor device sizes, there is ever increasing pressure on operating such circuitry accurately.

It is desirable to provide improved circuitry in the light of the above.

According to an embodiment of a first aspect of the present invention, there is provided differential attenuation circuitry, comprising: first and second input nodes; first and second output nodes; and an impedance network connected between the first and second input nodes and the first and second output nodes to provide a differential output voltage signal between the first and second output nodes which is attenuated compared/relative to a differential input voltage signal applied between the first and second input nodes, wherein the impedance network comprises: a common-mode node; a first impedance network connected between the first input node, the common-mode node and the first output node; and a second impedance network connected between the second input node, the common-mode node and the second output node, and wherein the differential attenuation circuitry further comprises: an input-to-input path comprising one or more impedances and one or more switches connected between the first and second input nodes to provide a current path independent of the common-mode node between the first and second input nodes (only) when the one or more switches of that path are ON; and/or an output-to-output path comprising one or more impedances and one or more switches connected between the first and second output nodes to provide a current path independent of the common-mode node between the first and second output nodes (only) when the one or more switches of that path are ON.

The differential attenuation circuitry (which may be referred to simply as attenuation circuitry) provides an attenuation that may be adjusted and avoids (or mitigates) non-linearity being introduced into the operation of the differential attenuation circuitry (or into the differential output voltage signal) by the switches. Further, the differential attenuation circuitry may achieve input impedance matching (i.e. may ensure that the output impedance of the differential attenuation circuitry matches the input impedance thereof), for example even when an attenuation is adjusted, and avoids (or mitigates) non-linearity being introduced into the operation of the differential attenuation circuitry (or into the differential output voltage signal) by the switches.

It may be said that the differential output voltage signal being attenuated compared/relative to the differential input voltage signal means that the differential output voltage signal has a reduced power/amplitude compared/relative to the differential input voltage signal.

It may be said that the one or more current paths are conductively separate from the common-mode node, and/or the one or more current paths do not pass through the common-mode node.

It may be said that the input-to-input path is configured/connected so that a current entering the provided current path from the first input node is the same as that exiting the provided current path at its other end to the second input node (and vice versa in AC terms).

It may be said that the output-to-output path is configured/connected so that a current entering the provided current path from the first output node is the same as that exiting the provided current path at its other end to the second output node (and vice versa in AC terms).

Each of the first impedance network and the second impedance network may comprise: an L-configuration attenuator; or a T-configuration attenuator; or a π-configuration attenuator.

The first impedance network may comprise a first input-output impedance connected between the first input node and the first output node and a first output-common impedance connected between the first output node and the common-mode node; and the second impedance network may comprise a second input-output impedance connected between the second input node and the second output node and a second output-common impedance connected between the second output node and the common-mode node.

Each of the first and second input-output impedances may be a resistor, or a resistor connected in parallel with a capacitor. Each of the first and second output-common impedances may be a resistor, or a resistor connected in series with an inductor.

The impedance network may comprise common-mode setting circuitry configured to set or define or bias the common mode voltage level at the common-mode node. The common-mode setting circuitry may comprise a potential divider. The common-mode setting circuitry may comprise a first common-mode setting impedance connected between a high voltage reference and the common-mode node, and a second common-mode setting impedance connected between a low voltage reference and the common-mode node.

The differential attenuation circuitry may comprise first and second electrostatic discharge, ESD, protection components. The first ESD protection component may comprise a first pair of diodes respectively connected between the first input node and a low voltage reference and between the first input node and a high voltage reference, a forward-direction of the first pair of diodes being from the low voltage reference to the high voltage reference, and the second ESD protection component may comprise a second pair of diodes respectively connected between the second input node and another low voltage reference and between the second input node and another high voltage reference, a forward-direction of the second pair of diodes being from the other low voltage reference to the other high voltage reference.

The first impedance network may be substantially the same as the second impedance network.

The one or more impedances and the one or more switches of the input-to-input path may comprise a first impedance, a central switch and a second impedance connected (in series) in that order between the first and second input nodes; and/or the one or more impedances and the one or more switches of the output-to-output path may comprise a first impedance, a central switch and a second impedance connected (in series) in that order between the first and second output nodes. In one arrangement, the central switch may be implemented as a plurality of switches connected together in series.

As another option, the one or more impedances and the one or more switches of the input-to-input path may comprise a first switch, a central impedance and a second switch connected (in series) in that order between the first and second input nodes; and/or the one or more impedances and the one or more switches of the output-to-output path may comprise a first switch, a central impedance and a second switch connected (in series) in that order between the first and second output nodes. In one arrangement, the central impedance may be implemented as a plurality of impedances connected together in series.

The first impedance and the second impedance of the input-to-input path may be substantially the same as one another; and/or the first impedance and the second impedance of the output-to-output path may be substantially the same as one another.

The central switch of the input-to-input path may comprise a transistor, such as a field-effect transistor; and/or the central switch of the output-to-output path may comprise a transistor, such as a field-effect transistor.

The differential attenuation circuitry may comprise a plurality of said input-to-input paths and/or a plurality of said output-to-output paths.

The differential attenuation circuitry may comprise control circuitry configured to control each said switch. The control circuitry may control each said switch so that the one or more switches of only one or none of the output-to-output paths are ON and the switch or switches of the other output-to-output paths are OFF, and/or so that the one or more switches of only one or none of the input-to-input paths is ON and the other switch or switches of the input-to-input paths are OFF.

The differential attenuation circuitry may comprise the input-to-input path and the output-to-output path, the input-to-input path may be a first input-to-input path, and the differential attenuation circuitry may comprise a second input-to-input path. The first input-to-input path may comprise a first auxiliary impedance, a first auxiliary switch, and a second auxiliary impedance connected (in series) in that order between the first and second input nodes, the second input-to-input path may comprise the first auxiliary impedance, a third auxiliary impedance, a second auxiliary switch, a fourth auxiliary impedance, and the second auxiliary impedance connected (in series) in that order between the first and second input nodes, and the output-to-output path may comprise a first attenuation impedance, a first attenuation switch, and a second attenuation impedance connected (in series) in that order between the first and second output nodes.

The control circuitry may be configured to control the attenuation and auxiliary switches so that: in a first operation mode the attenuation switch and the second auxiliary switch are OFF and the first auxiliary switch is ON; and/or in a second operation mode the attenuation switch and the second auxiliary switch are ON and the first auxiliary switch is OFF.

Each of the first and second input-output impedances and the first and second output-common impedances may have an impedance value of twice a unit resistance; and/or each of the first and second attenuation impedances may have an impedance value of the unit resistance; and/or each of the first to fourth auxiliary impedances may have an impedance value of four times the unit resistance.

Each of the first and second input-output impedances and the first and second output-common impedances may have an impedance value of twice a unit resistance; and/or each of the first and second attenuation impedances may have an impedance value of twice the unit resistance; and/or each of the first and second auxiliary impedances may have an impedance value of four times the unit resistance; and/or each of the third and fourth auxiliary impedances may have an impedance value of twice the unit resistance.

The differential attenuation circuitry may comprise the input-to-input path and the output-to-output path, the input-to-input path may be a first input-to-input path, and the output-to-output path may be a first output-to-output path. The first output-to-output path may comprise a first attenuation impedance, a first attenuation switch, and a second attenuation impedance connected (in series) in that order between the first and second output nodes. The differential attenuation circuitry may comprise a second output-to-output path comprising the first attenuation impedance, a third attenuation impedance, a second attenuation switch, a fourth attenuation impedance, and the second attenuation impedance connected (in series) in that order between the first and second output nodes. The first input-to-input path may comprise a first auxiliary impedance, a first auxiliary switch, and a second auxiliary impedance connected (in series) in that order between the first and second input nodes. The differential attenuation circuitry may comprise a second input-to-input path comprising the first auxiliary impedance, a third auxiliary impedance, a second auxiliary switch, a fourth auxiliary impedance, and the second auxiliary impedance connected (in series) in that order between the first and second input nodes. The differential attenuation circuitry may comprise a third input-to-input path comprising the first auxiliary impedance, the third auxiliary impedance, a fifth auxiliary impedance, a third auxiliary switch, a sixth auxiliary impedance, the fourth auxiliary impedance, and the second auxiliary impedance connected (in series) in that order between the first and second input nodes.

The control circuitry may be configured to control the attenuation and auxiliary switches so that: in a first operation mode the first auxiliary switch is ON and all the other auxiliary and attenuation switches are OFF; and/or in a second operation mode the second attenuation switch and the second auxiliary switch are ON and all the other auxiliary and attenuation switches are OFF, and/or in a third operation mode the first attenuation switch and the third auxiliary switch are ON and all the other auxiliary and attenuation switches are OFF.

Each of the first and second input-output impedances and the first and second output-common impedances may have an impedance value of twice a unit resistance; and/or each of the first to fourth attenuation impedances may have an impedance value of the unit resistance; and/or each of the first and second auxiliary impedances may have an impedance value of four times the unit resistance; and/or each of the third to sixth auxiliary impedances may have an impedance value of twice the unit resistance.

The auxiliary and attenuation impedances may be or may comprise resistors. The auxiliary and attenuation switches may be/comprise transistors, for example field effect transistors. Each said impedance may comprise a resistor, or a combination of two or more of a resistor, a capacitor and an inductor.

According to an embodiment of a second aspect of the present invention, there is provided differential attenuation circuitry, comprising: first and second input nodes; first and second output nodes; and an impedance network connected between the first and second input nodes and the first and second output nodes to provide a differential output voltage signal between the first and second output nodes which is attenuated compared/relative to a differential input voltage signal applied between the first and second input nodes, wherein the differential attenuation circuitry further comprises: an input-to-input path comprising one or more impedances and one or more switches connected between the first and second input nodes to provide a current path independent of the impedance network between the first and second input nodes when the one or more switches of that path are ON; and/or an output-to-output path comprising one or more impedances and one or more switches connected between the first and second output nodes to provide a current path independent of the impedance network between the first and second output nodes when the one or more switches of that path are ON.

According to an embodiment of a third aspect of the present invention, there is provided differential attenuation circuitry, comprising: first and second input nodes; first and second output nodes; and an impedance network connected between the first and second input nodes and the first and second output nodes to provide a differential output voltage signal between the first and second output nodes which is attenuated compared/relative to a differential input voltage signal applied between the first and second input nodes, wherein the impedance network comprises: a common-mode node;

a first impedance network connected between the first input node, the common-mode node and the first output node; and a second impedance network connected between the second input node, the common-mode node and the second output node, and wherein the differential attenuation circuitry further comprises: an input-to-input path comprising one or more impedances connected between the first and second input nodes to provide a current path independent of the common-mode node between the first and second input nodes; and/or an output-to-output path comprising one or more impedances connected between the first and second output nodes to provide a current path independent of the common-mode node between the first and second output nodes.

Any features of the first aspect may be applied to the second and/or third aspects.

According to an embodiment of a fourth aspect of the present invention, there is provided an analogue-to-digital converter comprising the differential attenuation circuitry of any of the first to third aspects.

According to an embodiment of a fifth aspect of the present invention, there is provided integrated circuitry, such as an IC chip, comprising the differential attenuation circuitry of any of the first to third aspects or the analogue-to-digital converter of the fourth aspect.

Features of any of the above aspects may be applied to any others of the above aspects.

Reference will now be made, by way of example, to the accompanying drawings, of which.

Figure 1:
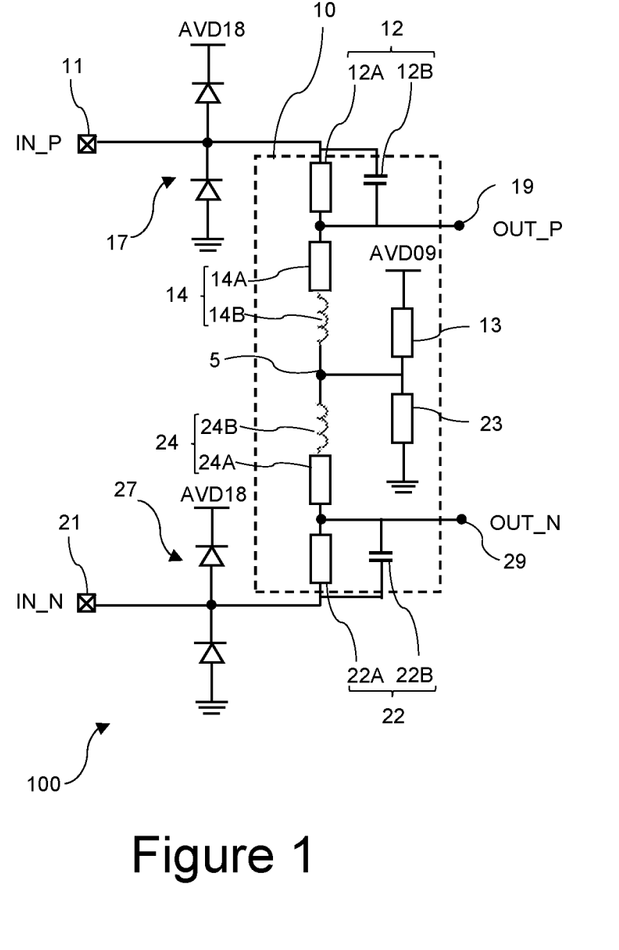
FIG. 1 is a schematic diagram of attenuation circuitry as a comparative example.

FIG. 1 is a schematic diagram of attenuation circuitry 100 as a comparative example. Attenuation circuitry 100 comprises first and second input nodes 11 and 21, first and second output nodes 19 and 29, and an impedance network 10 connected between the first and second input nodes 11 and 21 and the first and second output nodes 19 and 29. The input nodes are configured to receive a differential input voltage signal therebetween. The output nodes 19 and 29 are configured to output a differential output voltage signal therebetween. The impedance network 10 is configured to provide the differential output voltage signal between the output nodes 19 and 29 which is attenuated compared/relative to the differential input voltage signal. "Attenuation" here means that the differential output voltage signal has a reduced power/amplitude compared/relative to the differential input voltage signal.

The impedance network 10 comprises a first input-output impedance 12 connected between the first input node 11 and the first output node 19 and a first output-common impedance 14 connected between the first output node 19 and a common-mode node 5. The impedance network 10 further comprises a second input-output impedance 22 connected between the second input node 21 and the second output node 29 and a second output-common impedance 24 connected between the second output node 29 and the common-mode node 5. The first and second output-common impedances are each implemented as a resistor 14A/24A connected in series with an inductor 14B/24B. The first and second input-output impedances are each implemented as a resistor 12A/22A connected in parallel with a capacitor 12B/22B.

Impedance network 10 further comprises first and second common-mode setting impedances 13 and 23 for setting a common mode voltage. The first common-mode setting impedance 13 is connected between a high voltage reference, the common-mode node 5, and the second common-mode setting impedance 23 is connected between the common-mode node 5 and a low voltage reference (e.g. ground). Merely as an example, this voltage reference is denoted AVD09, indicating a 0.9V supply relative to ground.

The capacitors 12B and 22B of the input-output impedances 12 and 22, in combination with the inductors 14B and 24B of the output-common impedances 14 and 24, can achieve "peaking" in the gain profile—i.e. gain boosting at high (higher) frequencies of the differential input voltage signal compared to low (lower) frequencies of the differential input voltage signal. The capacitors 12B and 22B and the inductors 14B and 24B may therefore be referred to as peaking (or gain equalization) capacitors and peaking (or gain equalization) inductors, respectively.

In some arrangements, the capacitors 12B, 22B and/or the inductors 14B, 24B need not be provided. In that case, the resistors 14A, 24A may be directly connected to the common-mode node 5.

Attenuation circuitry 100 further comprises first and second electrostatic discharge (ESD) protection components 17 and 27, each of which comprises a diode connected between a high voltage reference and the input node 11 or 21, and another diode connected between the input node 11 or 21 and a low voltage reference, e.g. ground. Merely as an example, this voltage reference is denoted AVD18, indicating a 1.8V supply relative to ground.

Attenuation circuitry 100 employs an L configuration/design (this is explained in more detail below with reference to FIG. 4) and is "fixed" and not programmable (i.e. the attenuation level provided by the circuitry 100 cannot be programmed/adjusted). To make attenuation circuitry such as attenuation circuitry 100 programmable, active switches (such as transistors) may be used to effectively alter the impedance network 10. For example, such active switches may be used to connect a so-called "bridge" impedance between the first input node 11 and the first output node 19, and another bridge impedance between the second input node 21 and the second output node 29, and even to vary a value of such bridge impedances (to adjust amplification). As another example, such active switches may be used to connect a so-called "bridge" impedance between the first output node 19 and the common-mode node 5, and another bridge impedance between the second output node 29 and the common-mode node 5, and even to vary a value of such bridge impedances (to adjust attenuation). However, active switches suffer from non-linearity (i.e. as the voltage across them changes their resistance varies) and therefore when used in this way introduce non-linearity into the attenuation circuitry. This is undesirable and attenuation circuitry with linear behaviour is preferred.

Figure 2:
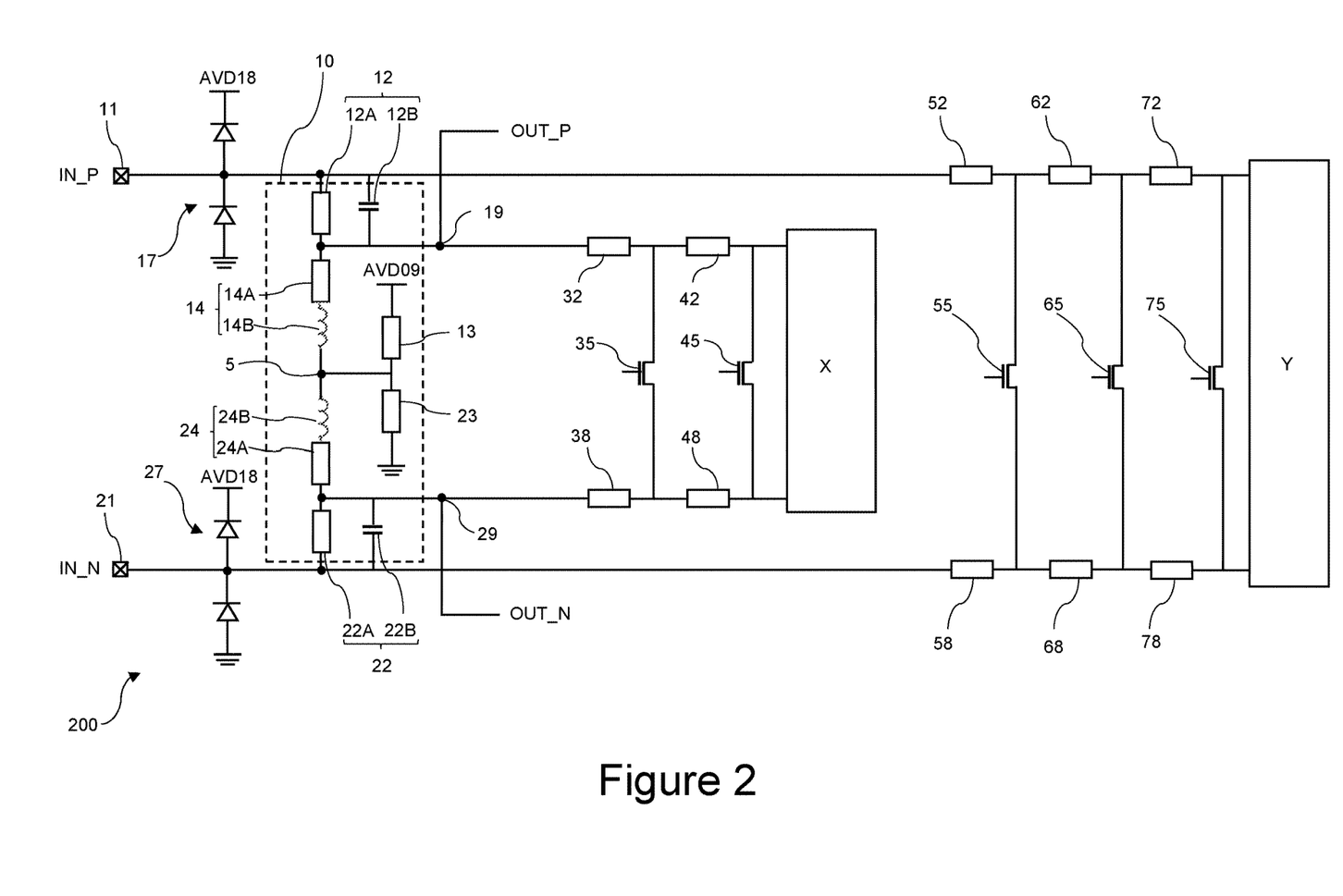
FIG. 2 is a schematic diagram of attenuation circuitry.

FIG. 2 is a schematic diagram of differential attenuation circuitry 200 embodying the present invention. Differential attenuation circuitry 200 will hereinafter be referred to as attenuation circuitry 200. Attenuation circuitry 200 comprises the following elements in common with attenuation circuitry 100: the first and second input nodes 11 and 21, the impedance network 10, the first and second output nodes 19 and 29, and the ESD protection components 17 and 27. Duplicate description is omitted.

The first and second common-mode setting impedances 13 and 23 and/or the capacitors 12B and 22B may be considered to be separate from the impedance network 10—that is, the impedance network 10 may be considered to comprise the first and second input-output impedances 12 and 22 (implemented as the resistors 12A and 22A) and the first and second output-common impedances 14 and 24. As shown in FIG. 2, the input-output impedances 12 and 22 may be implemented as the resistors 12A/22A connected in parallel with the capacitors 12B/22B (and therefore the impedance network 10 may be considered to comprise the capacitors 12B/22B). The impedance network 10 may be considered to comprise a first impedance network connected between the first input node 11, the common-mode node 5, and the first output node 19, and a second impedance network connected between the second input node 21, the common-mode node 5 and the second output node 29. The first impedance network thus comprises the first input-output impedance 12 and the first output-common impedance 14, and the second impedance network comprises the second input-output impedance 22 and the second output-common impedance 24. The impedance network 10 may be considered to comprise the common-mode node 5 or the common-mode node 5 may be considered to be a part of the attenuation circuitry 200 but not necessarily of the impedance network 10.

In some arrangements, the attenuation circuitry does not comprise the common-mode setting impedances 13 and 23 and the common mode voltage may be set in a different way, or it may be left "floating". In some arrangements, the attenuation circuitry does not comprise the ESD protection components 17 and 27.

The input-output impedances 12 and 22 are each implemented as a resistor 12A or 22A connected in parallel with a capacitor 12B or 22B in FIG. 2, however they may be implemented as resistors, or as inductors or a combination of inductors and resistors. The output-common impedances 14 and 24 are each implemented as a resistor 14A or 24A and an inductor 14B or 24B connected in series in FIG. 2, however they may be implemented as resistors or as inductors.

Attenuation circuitry 200 comprises a plurality of output-to-output paths each comprising impedances and a switch, each of which provides a current path independent of the common-mode node 5 between the first and second output nodes 19 and 29 when its switch is ON (and the other said switches of the output-to-output paths are OFF). Merely for convenience, the impedances and switches of the output-to-output paths will be labelled as "attenuation" impedances and switches.

A first output-to-output path comprises a first attenuation impedance 32, a first attenuation switch 35, and a second attenuation impedance 38 connected in series in that order between the first and second output nodes 19 and 29 to provide a current path independent of the common-mode node 5 between the first and second output nodes 19 and 29 when the switch 35 is ON (and the other said switches of the output-to-output paths are OFF). A second output-to-output path comprises the first attenuation impedance 32, a third attenuation impedance 42, a second attenuation switch 45, a fourth attenuation impedance 48, and the second attenuation impedance 38 connected in that order in series between the first and second output nodes 19 and 29 to provide a current path independent of the common-mode node 5 between the first and second output nodes 19 and 29 when the switch 45 is ON (and the other said switches of the output-to-output paths are OFF).

Figure 3:
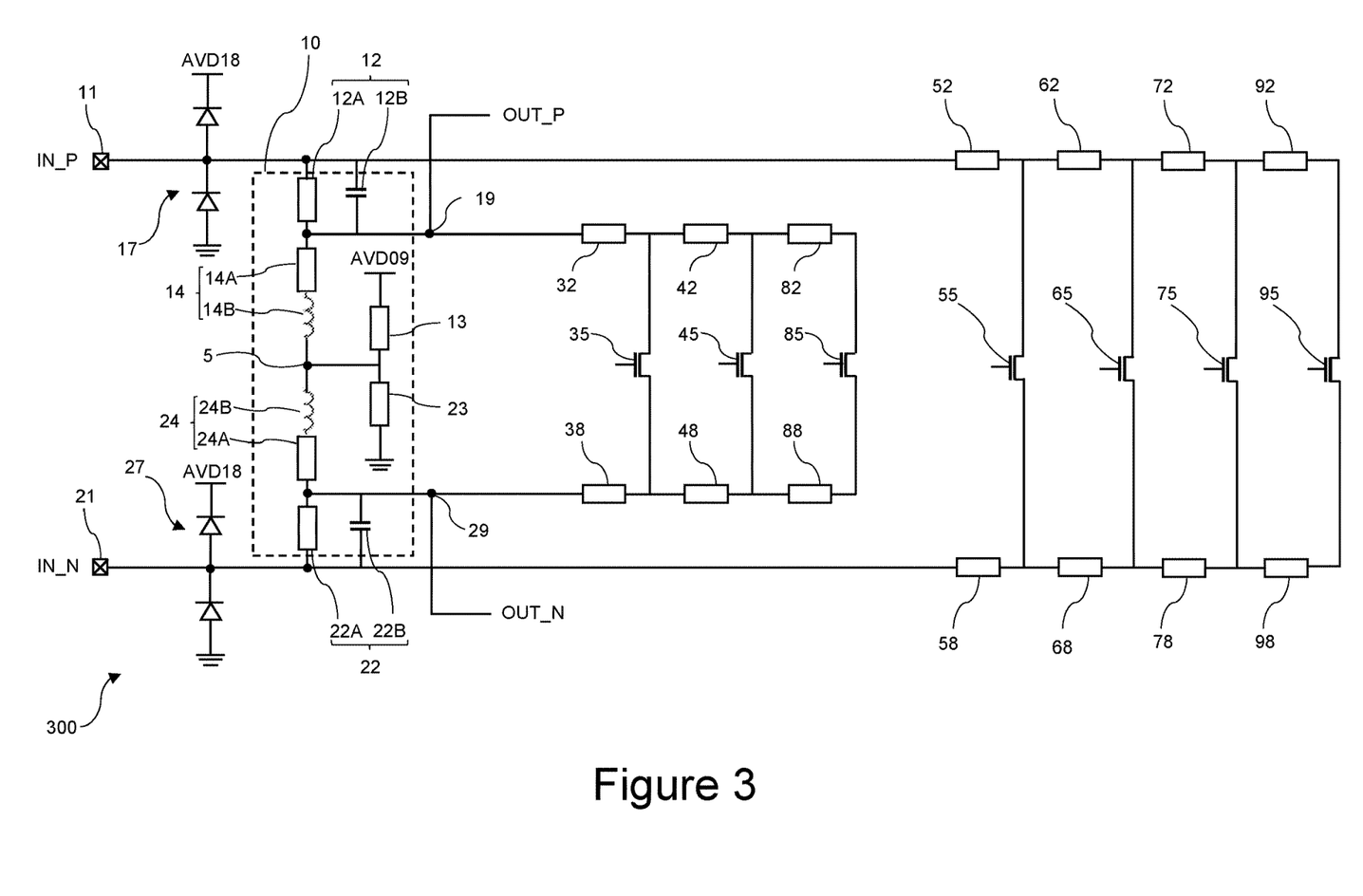
FIG. 3 is a schematic diagram of attenuation circuitry.

The box X in FIG. 2 shows that (any number of) further output-to-output paths could be included (e.g. as shown in FIG. 3), however the box X and any possible further output-to-output paths will be ignored in the following description of FIG. 2.

The attenuation circuitry 200 is configured so that only one (or none) of the attenuation switches 35 and 45 is ON, and so that the other is OFF, at any instant. By controlling which (if any) of the attenuation switches 35 and 45 is ON, the attenuation provided by the attenuation circuitry 200 may be adjusted.

Attenuation circuitry 200 comprises a plurality of input-to-input paths each comprising impedances and a switch, each of which provides a current path independent of the common-mode node 5 between the first and second input nodes 11 and 21 when its switch is ON (and the other said switches of the input-to-input paths are OFF). Merely for convenience, the impedances and switches of the input-to-input paths will be labelled as "auxiliary" impedances and switches.

A first input-to-input path comprises a first auxiliary impedance 52, a first auxiliary switch 55, and a second auxiliary impedance 58 connected in series in that order between the first and second input nodes 11 and 21 to provide a current path independent of the common-mode node 5 between the first and second input nodes 11 and 21 when the auxiliary switch 55 is ON (and the other said switches of the input-to-input paths are OFF). A second input-to-input path comprises the first auxiliary impedance 52, a third auxiliary impedance 62, a second auxiliary switch 65, a fourth auxiliary impedance 68, and the second auxiliary impedance 58 connected in that order in series between the first and second input nodes 11 and 21 to provide a current path independent of the common-mode node 5 between the first and second input nodes 11 and 21 when the switch 65 is ON (and the other said switches of the input-to-input paths are OFF). A third input-to-input path comprises the first auxiliary impedance 52, the third auxiliary impedance 62, a fifth auxiliary impedance 72, a third auxiliary switch 75, a sixth auxiliary impedance 78, the fourth auxiliary impedance 68, and the second auxiliary impedance 58 connected in that order in series between the first and second input nodes 11 and 21 to provide a current path independent of the common-mode node 5 between the first and second input nodes 11 and 21 when the switch 75 is ON (and the other said switches of the input-to-input paths are OFF).

The box Y in FIG. 2 shows that (any number of) further input-to-input paths could be included (e.g. as shown in FIG. 3), however the box Y and any possible further input-to-input paths will be ignored in the following description of FIG. 2.

The attenuation circuitry 200 is configured so that only one (or, in some arrangements, none) of the auxiliary switches 55, 65, and 75 is ON, and so that all the others are OFF, at any instant. The input-to-input paths provide an impedance at the output of attenuation circuitry 200. By controlling which one (if any) of the auxiliary switches 55, 65, and 75 is ON, the input impedance of the attenuation circuitry 200 can be adjusted for matching as the impedance between the output nodes 19 and 29 changes due to the control of the attenuation switches 35 and 45 (which is desirable e.g. for achieving an improved or acceptable S11 parameter).

Each current path provided by an input-to-input path or an output-to-output path (when its switch in ON) is independent of the common-mode node 5. In other words, none of the current paths passes through the common-mode node 5. In other words, each current path is conductively separate from the common-mode node 5 (along its length). In other words, none of the current paths is connected to the common-mode node 5 (other than via the first and second input/output nodes 11, 21, 19, and 29). In other words, the current entering each current path from the input/output node 11, 21, 19, or 29 is the same as that exiting that current path at its other end to the other input/output node 11, 21, 19, or 29 (and vice versa in AC terms). The current paths can be said to be independent of the impedance network 10.

The switches 35, 45, 55, 65, and 75 which may be used to program/control the attenuation level and/or input-impedance matching of the attenuation circuitry 200 are connected in current paths which are independent of the common-mode node 5 and therefore the non-linearity of the switches 35, 45, 55, 65, and 75 has little to no effect on the linearity of the attenuation circuitry 200 (i.e. of the differential output voltage signal). That is, each of the switches 35, 45, 55, 65, and 75 is at the common mode voltage level (or at least is arranged symmetrically around the common mode voltage level) which may be referred to as an "AC ground", and therefore any "voltage swing" across a said switch 35, 45, 55, 65, and 75 is very small compared to the swing between (or at) the first and second input nodes 11 and 21 and between (or at) the first and second output nodes 19 and 29 (i.e. of the differential input/output voltage signal). For example, the voltage swing across a said switch may be e.g. 20 mV. This value is of course an example only and it will be appreciated that many different values may be used/achieved. A relatively low voltage swing over the active switches leads to a relatively small impact of non-linearities associated with those switches. Further, currents in the input-to-input paths and output-to-output paths run along the lengths of those paths and thus non-linearity effects either side of AC ground effectively cancel out.

Put another way, for a given common-mode voltage (which is set by the impedances 13 and 23) and a given gate voltage, the common switch (i.e. each of the switches 35, 45, 55, 65 and 75) provides a symmetrical drain-source voltage VDs across the swing of the input signal (provided between nodes 11 and 21). This means that the same current entering the switch will exit it and therefore the current will flow from the positive input to the negative input (and vice versa in AC terms). The VDS signal will be proportional to the input signal. Due to the nature of the switch (i.e. each of the switches 35, 45, 55, 65, and 75), its ON resistance will also vary proportionally with the input signal. This in turn may cause additional non-linearity. To compensate for this the switch may be sized accordingly.

The effect of the output-to-output paths can be thought of as "trimming" (or tuning or adjusting) the first and second output-common impedances 14 and 24 (although it will be appreciated that those impedances are not actually adjusted). As such, in the FIG. 2 arrangement, no impedance that is connected between the first input node 11 and the first output node 19 or between the second input node 21 and the second output node 29 (e.g. the first and second input-output impedances 12 and 22) is trimmed, which also helps to avoid non-linear behaviour in the differential output voltage signal. This helps to avoid single-ended non-linear behaviour in the differential output voltage signal. Rather, the non-linearity (associated with each of the switches 35, 45, 55, 65 and 75) is applied differentially, thus equally to the positive and negative inputs.

In a particular implementation, the input-output impedances 12 and 22, the output-common impedances 14 and 24, and the third to sixth auxiliary impedances 62, 68, 72, and 78 each have a resistance value of 50 Ohms, the first to fourth attenuation impedances 32, 38, 42, and 48 each have a resistance value of 25 Ohms, and the first and second auxiliary impedances 52 and 58 each have a resistance value of 100 Ohms. In a first operation mode, both of the attenuation switches 35 and 45 are OFF and (of the auxiliary switches) only the first auxiliary switch 55 is ON. In this operation mode attenuation circuitry 200 provides a first attenuation level of −6 dB, and the single-ended input impedance is 50 Ohms (or 100 Ohms differentially). In a second operation mode, the second attenuation switch 45 is ON and the second auxiliary switch 65 is ON (whilst all other switches are OFF). In this second operation mode attenuation circuitry 200 provides a second attenuation level of −9 dB, and the single-ended input impedance is 50 Ohms (or 100 Ohms differentially). In a third operation mode, the first attenuation switch 35 is ON and the third auxiliary switch 75 is ON (whilst all the other switches are OFF). In this third operation mode attenuation circuitry 200 provides a third attenuation level of −12 dB, and the single-ended input impedance is 50 Ohms (or 100 Ohms differentially). In this implementation, the attenuation level may be adjusted in linear dB steps (−6 dB to −9 dB to −12 dB). Also, the input impedance may be kept constant as the attenuation level is adjusted, which is good for input impedance matching and therefore the reflection coefficient S11.

In the above implementation a unit resistance of 25 Ohms was used (and all impedances were multiples of this unit resistance). In other implementations other unit resistances may be used. It will be appreciated that many other values for any of the impedances may be used. In a particular implementation as described above, SFDR (spurious free dynamic range) figures better than 95 dB were achieved.

In other implementations, the attenuation circuitry 200 may comprise fewer input-to-input paths and/or fewer output-to-output paths.

FIG. 3 is a schematic diagram of differential attenuation circuitry (hereinafter referred to as attenuation circuitry) 300. Attenuation circuitry 300 is identical to attenuation circuitry 200 except the box X in FIG. 2 is here implemented as a further output-to-output path comprising fifth and sixth attenuation impedances 82 and 88 and a third attenuation switch 85, and the box Y in FIG. 2 is here implemented as a further input-to-input path comprising seventh and eighth auxiliary impedances 92 and 98 and a fourth attenuation switch 95. It will be appreciated that this is just an example, and the box X in FIG. 2 may comprise any number of further output-to-output paths in a similar manner. Similarly, the box Y in FIG. 2 may comprise any number of further input-to-input paths in a similar manner.

Attenuation circuitry 200 employs an L design for the impedance network 10 (i.e. an L-configuration attenuator for both the first and second impedance networks), however other structures for the impedance network 10 could be used in attenuation circuitry 200. Examples are shown in FIGS. 4, 5, and 6, however the skilled person will appreciate that other structures may similarly be employed.

Figure 4:
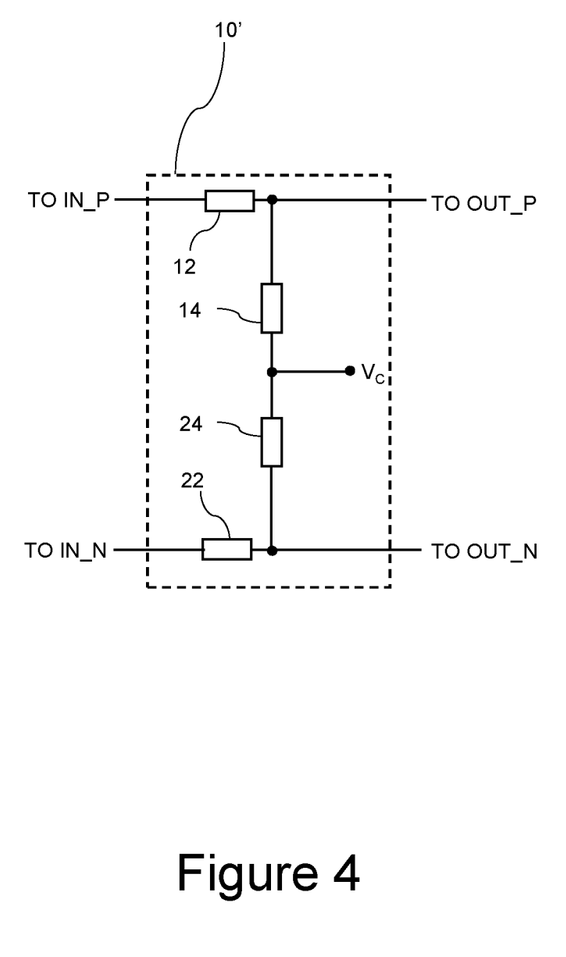
FIG. 4 is schematic diagram of an impedance network.

FIG. 4 is a schematic diagram illustrating a simplified impedance network 10' compared to the impedance network 10. The impedance network 10' is based on an L design (i.e. an L-configuration attenuator for both the first and second impedance networks) but does not explicitly show any capacitors, common-mode setting impedances, or inductors. Elements of impedance network 10' that are the same as those in impedance network 10 have the same reference numerals, and duplicate description is omitted. The impedances shown may be implemented as resistors, or as parallel or series combinations of resistors, capacitors and/or inductors, e.g. in line with the impedance network 10.

Figure 5:
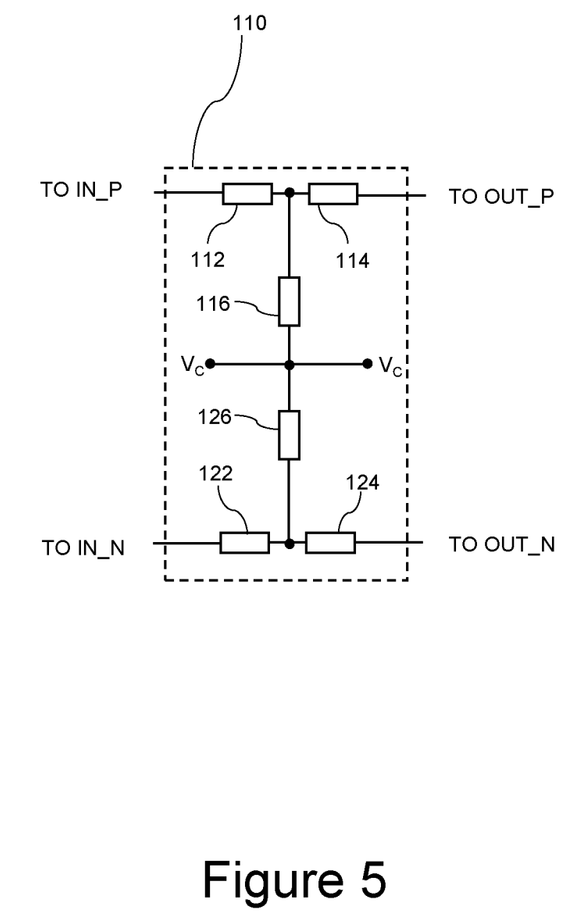
FIG. 5 is a schematic diagram of an impedance network.

FIG. 5 is a schematic diagram illustrating an impedance network 110 based on a T configuration/design (i.e. a T-configuration attenuator for both the first and second impedance networks) and comprises an impedance 116 connected between a common-mode node and a central node which is between impedances 112 and 114, and an impedance 126 connected between the common-mode node and another central node which is between impedances 122 and 124. As above, the impedances shown may be implemented as resistors, or as parallel or series combinations of resistors, capacitors and/or inductors, depending on the application.

Figure 6:
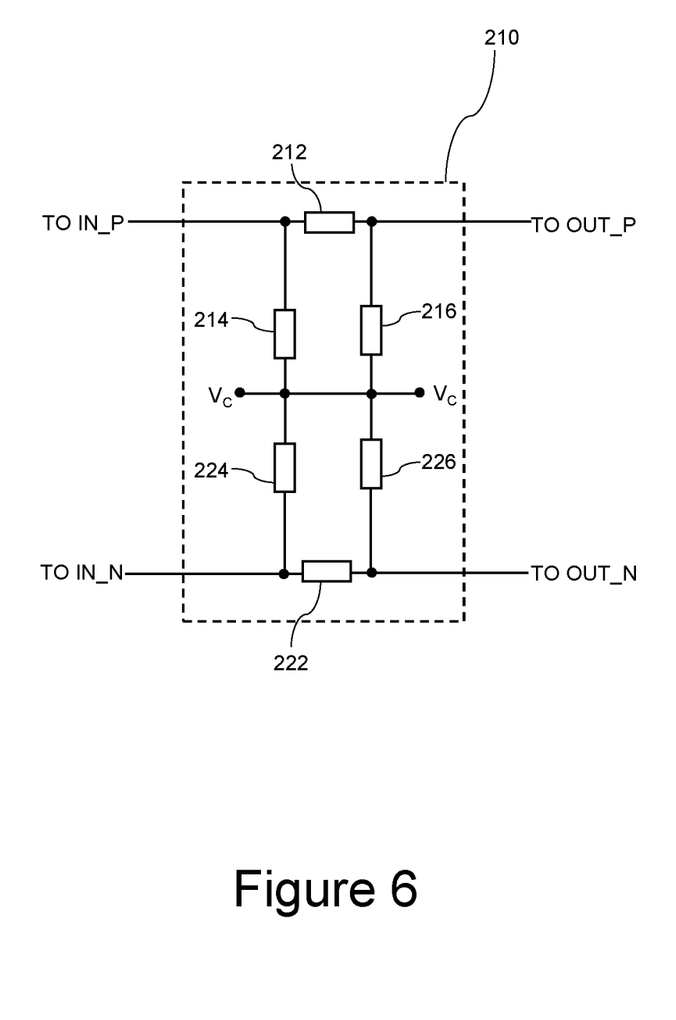
FIG. 6 is schematic diagram of an impedance network.

FIG. 6 is a schematic diagram illustrating an impedance network 210 based on a π configuration/design (i.e. a π-configuration attenuator for both the first and second impedance networks) and comprising impedances 214 and 216 connected between opposite ends, respectively, of an impedance 212 and a common-mode node, and impedances 224 and 226 connected between opposite ends, respectively, of an impedance 222 and the common-mode node. As above, the impedances shown may be implemented as resistors, or as parallel or series combinations of resistors, capacitors and/or inductors, depending on the application.

In each of the impedance networks 10', 110, and 210, the common mode voltage level at the common-mode node is indicated by $V_C$ and may be set or left "floating". In each of FIGS. 4-6 the connections to the input/output nodes 11, 21, 19, and 29 of the attenuation circuitry 200 are illustrated and it will appreciated that the impedance network 10 in attenuation circuitry 200 could be replaced with any of the impedance networks 10', 110, and 210.

Figure 7:
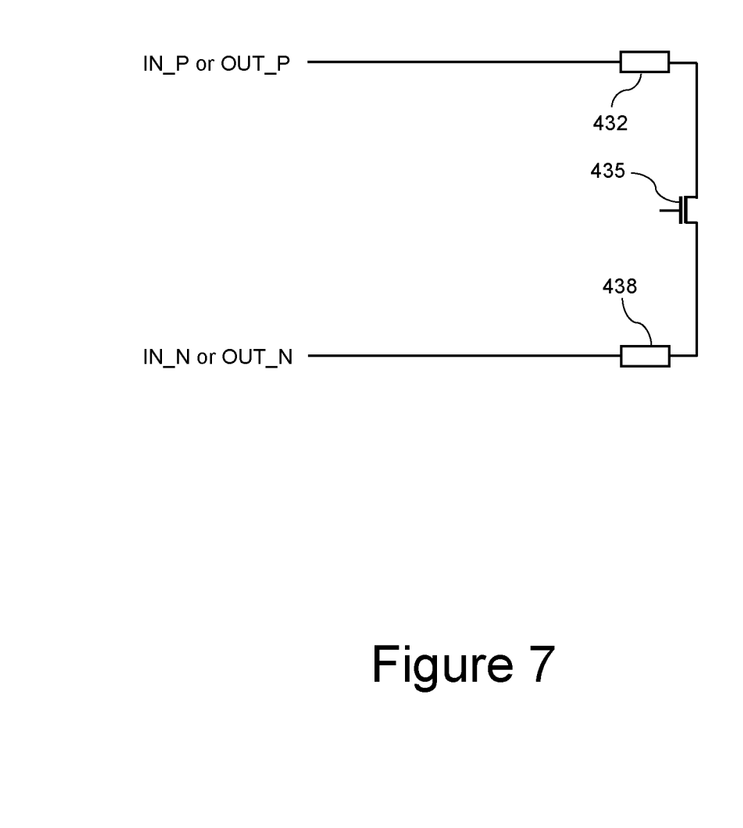
FIG. 7 is a schematic diagram of a part of attenuation circuitry.
Figure 8:
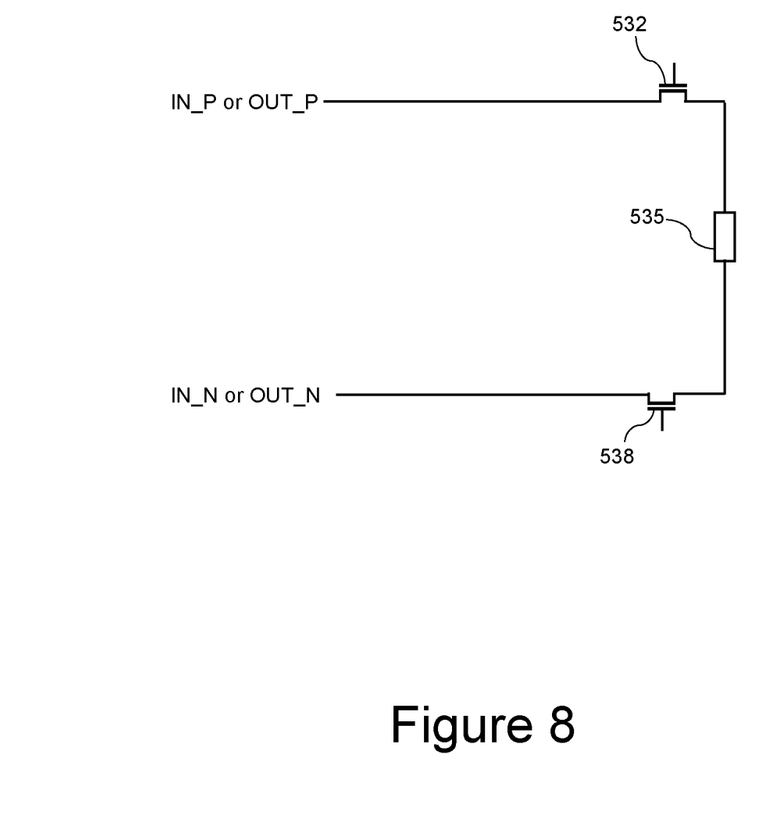
FIG. 8 is a schematic diagram of a part of attenuation circuitry.
Figure 9:
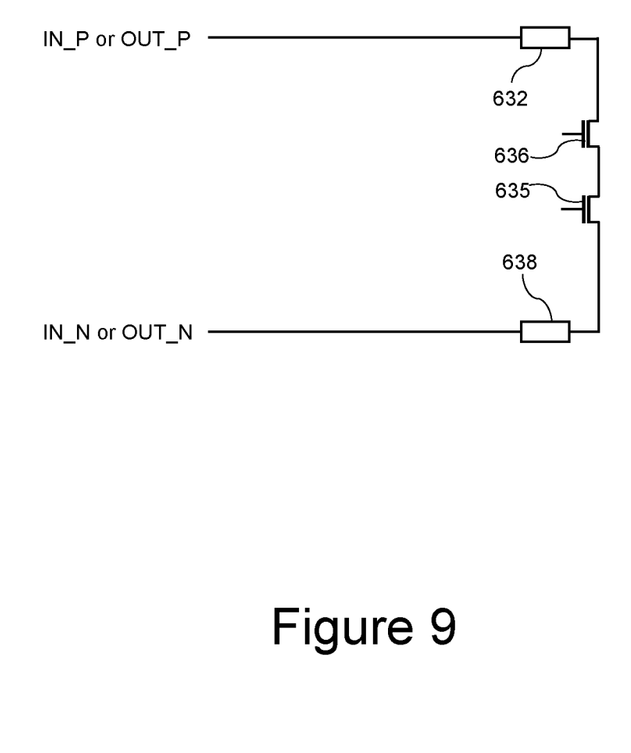
FIG. 9 is a schematic diagram of a part of attenuation circuitry.

The structure of the input-to-input and output-to-output paths illustrated in FIG. 2 is not essential and a structure as shown in any of FIGS. 7-9 could be used in attenuation circuitry 200.

FIG. 7 is a schematic diagram illustrating a structure of an input-to-input or output-to-output path that is used in the attenuation circuitry illustrated in FIG. 2, for ease of comparison, and which comprises an impedance 432, a switch 435 and another impedance 438 connected in that order in series between the input/output nodes. FIG. 8 is a schematic diagram illustrating a structure of an input-to-input or output-to-output path that could be used in attenuation circuitry 200, and which comprises a switch 532, an impedance 535, and another switch 538 connected in that order in series between the input/output nodes. FIG. 9 is a schematic diagram illustrating a structure of an input-to-input or output-to-output path that could be used in attenuation circuitry 200, and which comprises an impedance 632, a switch 636, another switch 635, and another impedance 638 connected in that order in series between the input/output nodes.

It will be appreciated that any of the structures illustrated in FIGS. 7-9 could be employed in attenuation circuitry 200, and that there exist many possible structures that could be used for the input-to-input and output-to-output paths. For example, in some implementations, instead of the structure illustrated in FIG. 2 in which some impedances are used for more than one path (e.g. the first attenuation impedance 32 is used for the first and second output-to-output paths), each path could be completely separate and arranged to not share impedances. A combination of "sharing" and "not sharing" impedances could also be used in other implementations— that is, some paths may "share" impedances as in FIG. 2, whereas other paths may not share any impedances.

Further, attenuation circuitry 200 in some implementations may comprise input-to-input and/or output-to-output paths comprising impedances and switches connected in parallel. For example, in some implementations of attenuation circuitry 200, the circuitry 200 could be controlled so that more than one of the attenuation switches 35 and 45 and/or more than one of the auxiliary switches 55, 65, and 75 are ON at the same time. Attenuation circuitry 200 may comprise control circuitry (not shown) configured to control the attenuation and auxiliary switches 35, 45, 55, 65, and 75. Attenuation circuitry 200 may comprise one input-to-input path and/or one output-to-output path. Attenuation circuitry 200 may comprise one or more input-to-input paths and/or one or more output-to-output paths with no switches—i.e. so that path or those paths are always "ON".

The attenuation circuitry 200 may comprise a feedback loop (not shown) which allows the control circuitry to control the switches based on the differential output voltage signal (or on another signal in a circuitry system comprising the attenuation circuitry 200), e.g. to attenuate/adjust the attenuation level "on the fly". It will be appreciated that input-to-input and output-to-output paths, and the impedances thereon, can be selected so as to achieve linear steps (in dB) of attenuation adjustment, or non-linear steps.

The attenuation and auxiliary impedances in FIG. 2 are illustrated as resistors, but they may be implemented in other ways (i.e. using combinations of two or more of resistors, capacitors and inductors), e.g. using resistors and inductors, or resistors and capacitors, or resistors, inductors and capacitors. The auxiliary and attenuation switches may be transistors, e.g. field effect transistors (FETs), such as metal-on-semiconductor field effect transistors (MOSFETs) or fin field-effect transistors (FinFETs).

Any of the above description relating to attenuation circuitry 200 of course applies equally to attenuation circuitry 300.

Figure 10:
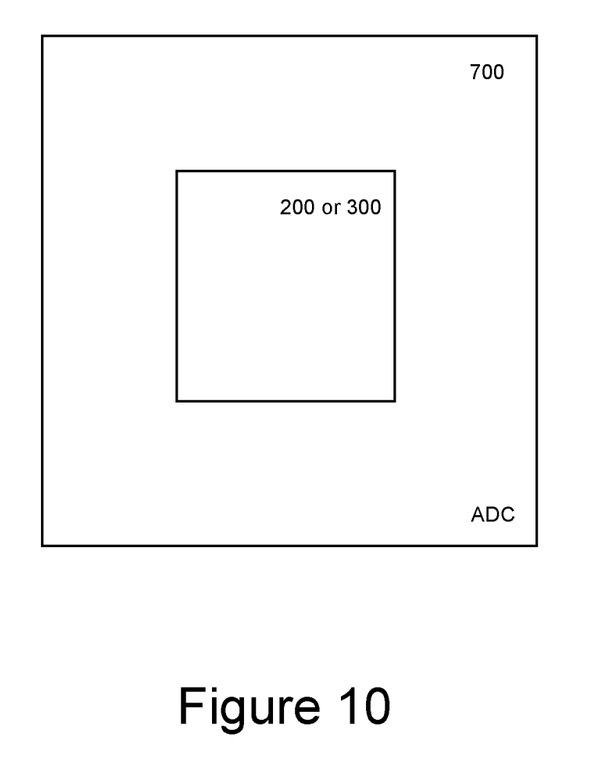
FIG. 10 is a schematic diagram of an ADC.

FIG. 10 is a schematic diagram illustrating an ADC 700 comprising attenuation circuitry 200 or 300. Attenuation circuitry 200 or 300 may be employed in the front-end of the ADC 700.

Figure 11:
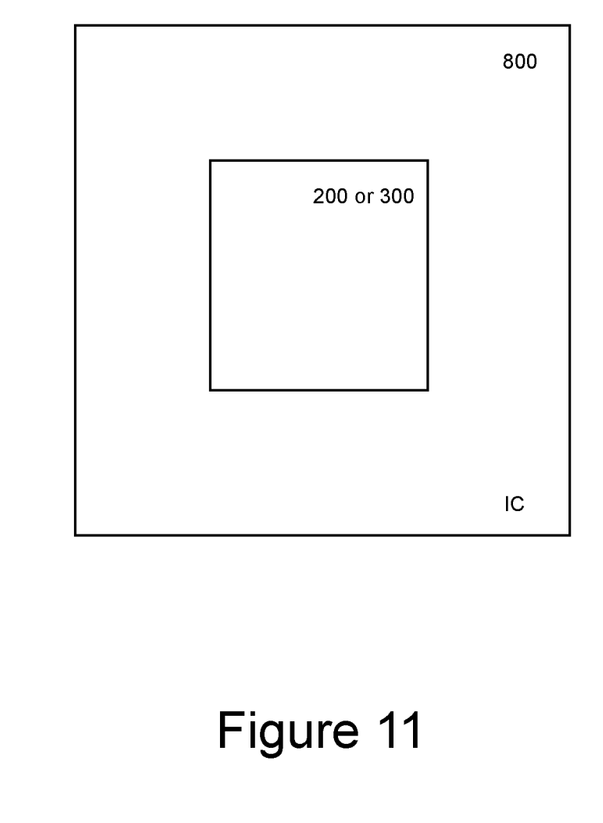
FIG. 11 is a schematic diagram of integrated circuitry.

FIG. 11 is a schematic diagram illustrating an integrated circuit (IC) 800 comprising attenuation circuitry 200 or 300.

Circuitry of the present invention may be implemented as integrated circuitry, for example on an IC chip such as a flip chip. The present invention extends to integrated circuitry and IC chips as mentioned above, circuit boards comprising such IC chips, and communication networks (for example, internet fiber-optic networks and wireless networks) and network equipment of such networks, comprising such circuit boards.

The invention claimed is:

1. Differential attenuation circuitry, comprising:
   first and second input nodes;
   first and second output nodes; and
   an impedance network connected between the first and second input nodes and the first and second output nodes to provide a differential output voltage signal between the first and second output nodes which is attenuated compared to a differential input voltage signal applied between the first and second input nodes,
   wherein the impedance network comprises:
      a common-mode node which is configured to define a common mode voltage level;
      a first impedance network connected between the first input node, the common-mode node and the first output node; and
      a second impedance network connected between the second input node, the common-mode node and the second output node,
   and wherein the differential attenuation circuitry further comprises:
      a first input-to-input path comprising one or more impedances and a switch connected between the first and second input nodes to provide a current path independent of the common-mode node between the first and second input nodes when the switch of that path is ON; and
      a first output-to-output path comprising one or more impedances and a switch connected between the first and second output nodes to provide a current path independent of the common-mode node between the first and second output nodes when the switch of that path is ON,
   wherein the switch of the first input-to-input path and the switch of the first output-to-output path are transistors,
   wherein the one or more impedances and the switch of the first input-to-input path comprise a first auxiliary impedance, a first auxiliary switch and a second auxiliary impedance connected in series in that order between the first and second input nodes,
   wherein the differential attenuation circuitry comprises a second input-to-input path comprising the first auxiliary impedance, a third auxiliary impedance, a second auxiliary switch, a fourth auxiliary impedance, and the second auxiliary impedance connected in series in that order between the first and second input nodes.

2. The differential attenuation circuitry as claimed in claim 1, wherein:
   the first impedance network comprises a first input-output impedance connected between the first input node and the first output node and a first output-common impedance connected between the first output node and the common-mode node; and
   the second impedance network comprises a second input-output impedance connected between the second input node and the second output node and a second output-common impedance connected between the second output node and the common-mode node.

3. The differential attenuation circuitry as claimed in claim 1, wherein the first impedance network is substantially the same as the second impedance network.

4. The differential attenuation circuitry as claimed in claim 1, wherein:
   the one or more impedances and the switch of the first output-to-output path comprise a first attenuation impedance, an attenuation switch and a second attenuation impedance connected in that order between the first and second output nodes.

5. The differential attenuation circuitry as claimed in claim 4, wherein:
   the first auxiliary impedance and the second auxiliary impedance of the first input-to-input path are substantially the same as one another; and/or
   the first attenuation impedance and the second attenuation impedance of the output-to-output path are substantially the same as one another.

6. The differential attenuation circuitry as claimed in claim 4, comprising control circuitry configured to control the attenuation and auxiliary switches so that:
   in a first operation mode the attenuation switch and the second auxiliary switch are OFF and the first auxiliary switch is ON; and/or
   in a second operation mode the attenuation switch and the second auxiliary switch are ON and the first auxiliary switch is OFF.

7. The differential attenuation circuitry as claimed in claim 1, comprising control circuitry configured to control each said switch.

8. The differential attenuation circuitry as claimed in claim 1, wherein:
   the first output-to-output path comprises a first attenuation impedance, a first attenuation switch, and a second attenuation impedance connected in that order between the first and second output nodes;
   the differential attenuation circuitry comprises a second output-to-output path comprising the first attenuation impedance, a third attenuation impedance, a second attenuation switch, a fourth attenuation impedance, and the second attenuation impedance connected in that order between the first and second output nodes; and
   the differential attenuation circuitry comprises a third input-to-input path comprising the first auxiliary impedance, the third auxiliary impedance, a fifth auxiliary impedance, a third auxiliary switch, a sixth auxiliary impedance, the fourth auxiliary impedance, and the second auxiliary impedance connected in that order between the first and second input nodes.

9. The differential attenuation circuitry as claimed in claim 8, comprising control circuitry configured to control the attenuation and auxiliary switches so that:

in a first operation mode the first auxiliary switch is ON and all the other auxiliary and attenuation switches are OFF; and/or in a second operation mode the second attenuation switch and the second auxiliary switch are ON and all the other auxiliary and attenuation switches are OFF, and/or in a third operation mode the first attenuation switch and the third auxiliary switch are ON and all the other auxiliary and attenuation switches are OFF.

10. An analogue-to-digital converter comprising the differential attenuation circuitry as claimed in claim 1.

11. Integrated circuitry, such as an IC chip, comprising the analogue-to-digital converter of claim 10.

12. Integrated circuitry, such as an IC chip, comprising the differential attenuation circuitry as claimed in claim 1.

13. Differential attenuation circuitry, comprising:
   first and second input nodes;
   first and second output nodes; and
   an impedance network connected between the first and second input nodes and the first and second output nodes to provide a differential output voltage signal between the first and second output nodes which is attenuated compared to a differential input voltage signal applied between the first and second input nodes,
   wherein the impedance network comprises:
      a common-mode node which is configured to define a common mode voltage level;
      a first impedance network connected between the first input node, the common-mode node and the first output node; and
      a second impedance network connected between the second input node, the common-mode node and the second output node,
   and wherein the differential attenuation circuitry further comprises:
      an input-to-input path comprising one or more impedances and a switch connected between the first and second input nodes to provide a current path independent of the common-mode node between the first and second input nodes when the switch of that path is ON; and
      a first output-to-output path comprising one or more impedances and a switch connected between the first and second output nodes to provide a current path independent of the common-mode node between the first and second output nodes when the switch of that path is ON,
   wherein the switch of the input-to-input path and the switch of the first output-to-output path are transistors,
   wherein the one or more impedances and the switch of the first output-to-output path comprise a first attenuation impedance, a first attenuation switch and a second attenuation impedance connected in series in that order between the first and second output nodes,
   wherein the differential attenuation circuitry comprises a second output-to-output path comprising the first attenuation impedance, a third attenuation impedance, a second attenuation switch, a fourth attenuation impedance, and the second attenuation impedance connected in series in that order between the first and second output nodes.

* * * * *